US007310785B2

(12) United States Patent
Sha et al.

(10) Patent No.: US 7,310,785 B2
(45) Date of Patent: Dec. 18, 2007

(54) VIDEO PROCESSING ARCHITECTURE DEFINITION BY FUNCTION GRAPH METHODOLOGY

(75) Inventors: Li Sha, San Jose, CA (US); Weimin Zeng, San Jose, CA (US)

(73) Assignee: Micronas USA, Inc., Santa Clara, CA (US)

( * ) Notice: Subject to any disclaimer, the term of this patent is extended or adjusted under 35 U.S.C. 154(b) by 421 days.

(21) Appl. No.: 11/105,772

(22) Filed: Apr. 13, 2005

(65) Prior Publication Data

US 2006/0143588 A1 Jun. 29, 2006

Related U.S. Application Data

(60) Provisional application No. 60/635,114, filed on Dec. 10, 2004.

(51) Int. Cl.
*G06F 17/50* (2006.01)
(52) U.S. Cl. .................. 716/1; 716/4; 716/18
(58) Field of Classification Search ............... None
See application file for complete search history.

(56) References Cited

U.S. PATENT DOCUMENTS

| | | | |
|---|---|---|---|
| 5,384,912 A | 1/1995 | Ogrinc et al. | |
| 6,075,906 A | 6/2000 | Fenwick et al. | |
| 6,177,922 B1 | 1/2001 | Schiefer et al. | |
| 6,281,873 B1 | 8/2001 | Oakley | |
| 6,347,154 B1 | 2/2002 | Karanovic et al. | |
| 6,618,445 B1 | 9/2003 | Peng et al. | |
| 6,832,363 B2 * | 12/2004 | Ohnishi | 716/18 |
| 6,848,085 B2 * | 1/2005 | Panchul et al. | 716/3 |
| 6,993,736 B2 * | 1/2006 | Syed et al. | 716/4 |
| 7,006,960 B2 * | 2/2006 | Schaumont et al. | 703/15 |
| 7,020,854 B2 * | 3/2006 | Killian et al. | 716/1 |
| 2001/0046260 A1 | 11/2001 | Molloy | |
| 2001/0052944 A1 | 12/2001 | Kim | |
| 2002/0168010 A1 | 11/2002 | Ali | |
| 2003/0007562 A1 | 1/2003 | Kerofsky et al. | |
| 2003/0012276 A1 | 1/2003 | Zhong et al. | |
| 2003/0095711 A1 | 5/2003 | McGuinness et al. | |
| 2003/0138045 A1 | 7/2003 | Murdock et al. | |
| 2003/0156650 A1 | 8/2003 | Campisano et al. | |
| 2003/0198399 A1 | 10/2003 | Atkins | |
| 2004/0010479 A1 | 1/2004 | Ali | |
| 2004/0085233 A1 | 5/2004 | Linzer et al. | |
| 2004/0240559 A1 | 12/2004 | Prakasam et al. | |

(Continued)

OTHER PUBLICATIONS

ITU-T H.264—Series H: Audiovisual and Multimedia Systems Infrastructure of audiovisual services—Coding of moving video. International Telecommunication Union, Mar. 2005; pp. xiii-330.

(Continued)

*Primary Examiner*—Leigh M. Garbowski
(74) *Attorney, Agent, or Firm*—Mayer Brown LLP

(57) ABSTRACT

A design technique is disclosed that allows video processing hardware designers to effectively employ the requirements of a video processing standard (e.g., H.264 specification or other such standard) during the hardware architecture design phase of the design process. The technique eliminates or otherwise reduces costly multiple passes through the resource intensive implementation and verification portions of the design process, and allows designers to make changes to the hardware architecture design, thereby ensuring verification at the implementation phase.

20 Claims, 6 Drawing Sheets

U.S. PATENT DOCUMENTS

2004/0260739 A1    12/2004    Schumann
2004/0263361 A1    12/2004    Pearson et al.
2005/0001745 A1    1/2005    Sankaran

OTHER PUBLICATIONS

"AVC/MPEG High-Definition Decoder", Broadcom Corporation [online] [Retrieved on Sep. 7, 2005]. Retrieved from the Internet: <URL: http://www.broadcom.com/products/Cable/HDTV-SDTV-Video,-Graphics-%26-Receiver-Chips/BCM7411>. 2 pages.

"BCM7411 Product Brief", Broadcom Corporation [online] [Retrieved on Dec. 8, 2005] Retrieved from the Internet: <URL: http://www.broadcom.com/collateral/pb/7411-PB05-R.pdf>. 2 pages.

"Broadcom Announces High Definition TV Decoder Reference Design Platform Featuring H.264 Advanced Video Compression", Broadcom Corporation [online] [Retrieved on Sep. 7, 2005]. Retrieved from the Internet: <URL: http://www.broadcom.com/press/release.php?id=660337. 4 pages.

Burger, Douglas et al., "Memory Systems", The Computer Science and Engineering Handbook, Ed. Allen B. Tucker, 1997, pp. 447-461, CRC Press, Boca Raton, FL.

"Differential Motion Vectors" [online] [Retrieved on Oct. 14, 2002] Retrieved from the Internet: <URL: http://www.cmlab.csie.ntu.edu.tw/cml/dsp/training/coding/h263/motion.html>. 2 pages.

"Dual Channel AVC High-Definition Reference Platform", Broadcom Corporation [online] [Retrieved on Dec. 14, 2005] Retrieved from the Internet: <URL: http://www.broadcom.com/collateral/pb/97395-PB00-R.pdf>. 2 pages.

"Dual High-Definition Digital Video System-on-Chip Solution for Cable, Satellite, and DTV", Broadcom Corporation [online] [Retrieved on Dec. 14, 2005]. Retrieved from the Internet: <URL: http://www.broadcom.com/collateral/pb/7038-PB01-R.pdf>. 2 pages.

"EM8400", Sigma Designs [online] Jan. 9, 2003 [Retrieved on Dec. 8, 2005] Retrieved from the Internet: <URL: http://www.sigmadesigns.com/pdf_docs/em8400brochure.pdf>. 2 pages.

"EM8470", Sigma Designs [online] Mar. 20, 2003 [Retrieved on Dec. 8, 2005] Retrieved from the Internet: <URL: http://www.sigmadesigns.com/pdf_docs/em847xbrochure.pdf>. 2 pages.

"EM8485", Sigma Designs [online] Apr. 30, 2003 [Retrieved on Sep. 7, 2005] Retrieved from the Internet: <URL: http://www.sigmadesigns.com/pdf_docs/EM8485brochure.pdf>. 2 pages.

"EM8500", Sigma Designs [online] Jan. 16, 2004 [Retrieved on Dec. 8, 2005] Retrieved from the Internet: <URL: http://www.sigmadesigns.com/pdf_docs/em8500_brochure.pdf>. 2 pages.

"EM8610", Sigma Designs [online] Jan. 13, 2004 [Retrieved on Dec. 8, 2005] Retrieved from the Internet: <URL: http://www.sigmadesigns.com/pdf_docs/em8610_brochure.pdf>. 2 pages.

"EM8610L", Sigma Designs [online] Aug. 2005 [Retrieved on Dec. 8, 2005] Retrieved from the Internet: <URL: http://www.sigmadesigns.com/pdf_docs/EM8610LSeries_br.pdf>. 2 pages.

"H.264 Advanced Video Coding: A Whirlwind Tour", PixelTools [online] [Retrieved on Sep. 7, 2005] Retrieved from the Internet: <URL: http://www.pixeltools.com/h264_paper.html>. 8 pages.

"H.264/MPEG-4 Part 10 Advanced Video Coding", Moonlight Technology [online] [Retrieved on Sep. 7, 2005] Retrieved from the Internet: <URL: http://www.moonlight.co.il/technology/h264/>. 2 pages.

"H.264 Video Decoder for HDTV", Sci-Worx [online] [Retrieved on Sep. 7, 2005] Retrieved from the Internet: <URL: http://www.sci-worx.com/uploads/media/H264VD.pdf>. 2 pages.

"MPEG-4 AVC/H.264 Video Decoder", Conexant Systems, Inc. [online] [Retrieved on Dec. 8, 2005] Retrieved from the Internet: <URL: http://www.conexant.com/servlets/DownloadServlet/102551A.pdf?FileId=1870>. 2 pages.

Schafer, Ralf et al., "The Emerging H.264/AVC Standard", EBU Technical Review, Jan. 2003, 12 pages.

Tourapis, Alexis M. et al., "Motion Vector Prediction With Reference Frame Consideration", 8 pages.

"Video DSP", TechnoWorld, Sony Corporation [online] [Retrieved on Dec. 8, 2005] Retrieved from the Internet: <URL: http://www.sony.net/Products/SC-HP/cx_news/vol13/pdf/tw_dsp.pdf>. 4 pages.

Wiegand, Thomas, "Context-Based Adaptive Coding and the Emerging H.26L Video Compression Standard", 27 pages, Heinrich Hertz Institute, Berlin, Germany, no date provided.

\* cited by examiner

US 7,310,785 B2

VIDEO PROCESSING ARCHITECTURE DEFINITION BY FUNCTION GRAPH METHODOLOGY

RELATED APPLICATIONS

This application claims the benefit of U.S. Provisional Application No. 60/635,114, filed on Dec. 10, 2004, which is herein incorporated in its entirety by reference.

FIELD OF THE INVENTION

The invention relates to video processing architecture design, and more particularly, to generating a video processing architecture definition by function graph methodology.

BACKGROUND OF THE INVENTION

Designing a video processing architecture requires the consideration of a number of factors. Each functional block of the architecture design must be clearly and precisely defined, as well as the flow of data and control information between the functional blocks. The architecture design must then be mapped into real-life scenarios and applications. The resulting implementation of the architecture design for an actual application must then be evaluated to confirm that the desired performance goals and bandwidth requirements are satisfied.

Typically, a high-level hardware description language (HDL) is used for defining circuit architectures at the component, board, and system levels. Circuit models can be developed at a very high level of abstraction. One such language is known as register transfer level (RTL), which allows digital circuits to be described as a collection of Boolean equations, registers, control logic (e.g., if-then-else statements), and complex event sequences. Commonly used RTL languages include, for example, VHDL and Verilog.

Once the architecture design is described as an RTL implementation, that RTL implementation is then synthesized into a gate-level netlist. The resulting schematic of the gate level netlist can then be used as a guide for the overall block and function placement (floor planning), specific gate placement (pick-n-place), and layout of physical interconnections (routing). Once the implementation is achieved, it can be verified using a C-model that is derived from the specification.

FIG. 1 illustrates the flow of conventional video processing architecture design process. As can be seen, the design process starts with the applicable specification or standard, such as the H.264 standard, also known as the Advanced Video Coding (AVC) standard. This specification is a high compression digital video codec standard produced by the Joint Video Team (JVT), and is identical to ISO MPEG-4 part 10, and is herein incorporated by reference in its entirety.

The next step in the design process is the hardware architecture design. A significant problem that hardware architecture designers face is that the H.264 specification is difficult to comprehend from a designers point of view and provides little structural guidelines. In this sense, there is a disconnect between the specification and hardware architecture design portions of the design process. After the hardware architecture design phase, the design process proceeds to RTL implementation. A C-model based in the specification is used to performance test the implementation and hardware architecture design.

Substantial time and resources are generally expended during the implementation phase of the hardware architecture design. Once at the implementation stage of the design process, only limited changes can be made at the implementation level without penalty. In addition, any changes necessary to the hardware architecture design after the implementation process generally come with a heavy penalty. In particular, once the hardware architecture design is adjusted, the implementation process must be repeated, at the cost of additional time and resources. Thus, if the verification process fails, the design process must be started over and is repeated until a proposed hardware architecture design is verified.

What is needed, therefore, are design techniques that allow video processing hardware designers to effectively employ the requirements of the H.264 specification (or other appropriate video processing standard) during the hardware architecture design phase of the design process. Such techniques would eliminate or otherwise reduce costly multiple passes through the implementation and verification portions of the design process.

SUMMARY OF THE INVENTION

One embodiment of the present invention provides a method for designing video processing architecture in accordance with a video processing a particular specification (e.g., H.264 or other video processing standard). The method includes generating a function graph that graphically represents criteria of the specification. The function graph has input from an external source, and provides output to an external target. The external source and target could be, for example, a RAM or other storage location. The function graph includes a plurality of functional nodes each for performing a specific data processing function, one or more data elements input to and/or output from a functional node, inter-node communication between the functional nodes, and control information provided by a functional node to control another functional node or inter-node-communication. The method continues with generating a hardware architecture design for a video processing application, and comparing that hardware architecture design to the function graph to determine if the design complies with the function graph. In response to determining the hardware architecture design complies with the functional graph, the method continues with providing a final architecture for register transfer level (RTL) implementation. In response to determining the hardware architecture design does not comply with the functional graph, the method may further include allowing adjustment to the hardware architecture design as necessary.

In one particular embodiment, generating a function graph that graphically represents criteria of the specification includes accessing one or more electronic libraries that store external sources/targets, functional nodes, data elements, inter-node communication, and control information components reflected in the specification. In another particular embodiment, comparing the hardware architecture design to the function graph is carried out using electronic logical comparisons between one or more components of the function graph and a corresponding one or more components of the hardware architecture design.

The method may further include performing RTL implementation of the final architecture. In one such case, the method further includes comparing the RTL implementation to a C-model derived from the specification to determine if the RTL implementation complies with the C-model. In response to determining the RTL implementation complies with the C-model, the method may further include providing a final RTL implementation that can be synthesized into a gate-level netlist. In response to determining the RTL implementation does not comply with the C-model, the method may include allowing adjustment to the RTL implementation as necessary.

Another embodiment of the present invention provides a system for designing video processing architecture in accordance with a video processing a particular specification (e.g., H.264 or other video processing standard). The system includes a function graph module for generating a function graph that graphically represents criteria of the specification. The function graph has input from an external source, and provides output to an external target. The function graph includes a plurality of functional nodes each for performing a specific data processing function, one or more data elements input to and/or output from a functional node, inter-node communication between the functional nodes, and control information provided by a functional node to control another functional node or inter-node-communication. A hardware architecture design module is configured for generating a hardware architecture design for a video processing application, and an architecture verification module is configured for comparing the hardware architecture design to the function graph to determine if the design complies with the function graph, and if so, for providing a final architecture for register transfer level (RTL) implementation.

In response to determining the hardware architecture design does not comply with the functional graph, the architecture verification module may be further configured to allow adjustment to the hardware architecture design as necessary. In one particular embodiment, the function graph module may be further configured to access one or more electronic libraries that store external sources/targets, functional nodes, data elements, inter-node communication, and control information components reflected in the specification. In another particular embodiment, the architecture verification module is further configured to carryout electronic logical comparisons between one or more components of the function graph and a corresponding one or more components of the hardware architecture design.

The system may include an RTL implementation module configured for performing RTL implementation of the final architecture. The system may include an implementation verification module configured for comparing the RTL implementation to a C-model derived from the specification to determine if the RTL implementation complies with the C-model. In response to determining the RTL implementation complies with the C-model, the implementation verification module may be further configured to provide a final RTL implementation that can be synthesized into a gate-level netlist. In response to determining the RTL implementation does not comply with the C-model, the implementation verification module may be further configured to allow adjustment to the RTL implementation as necessary.

The features and advantages described herein are not all-inclusive and, in particular, many additional features and advantages will be apparent to one of ordinary skill in the art in view of the figures and description. Moreover, it should be noted that the language used in the specification has been principally selected for readability and instructional purposes, and not to limit the scope of the inventive subject matter.

BRIEF DESCRIPTION OF THE DRAWINGS

FIG. 3b illustrates an example hardware architecture design that is non-compliant with the function graph of FIG. 3a.

FIG. 3c illustrates an example hardware architecture design that is compliant with the function graph of FIG. 3a.

DETAILED DESCRIPTION OF THE INVENTION

A design technique is provided that allows video processing hardware designers to effectively employ the requirements of the H.264 specification (or other appropriate video processing standard) during the hardware architecture design phase of the design process. The technique eliminates or otherwise reduces costly multiple passes through the implementation and verification portions of the design process, and allows designers to make changes to the hardware architecture design, thereby ensuring verification at the implementation phase.

Methodology and Design Flow

Figure 1:
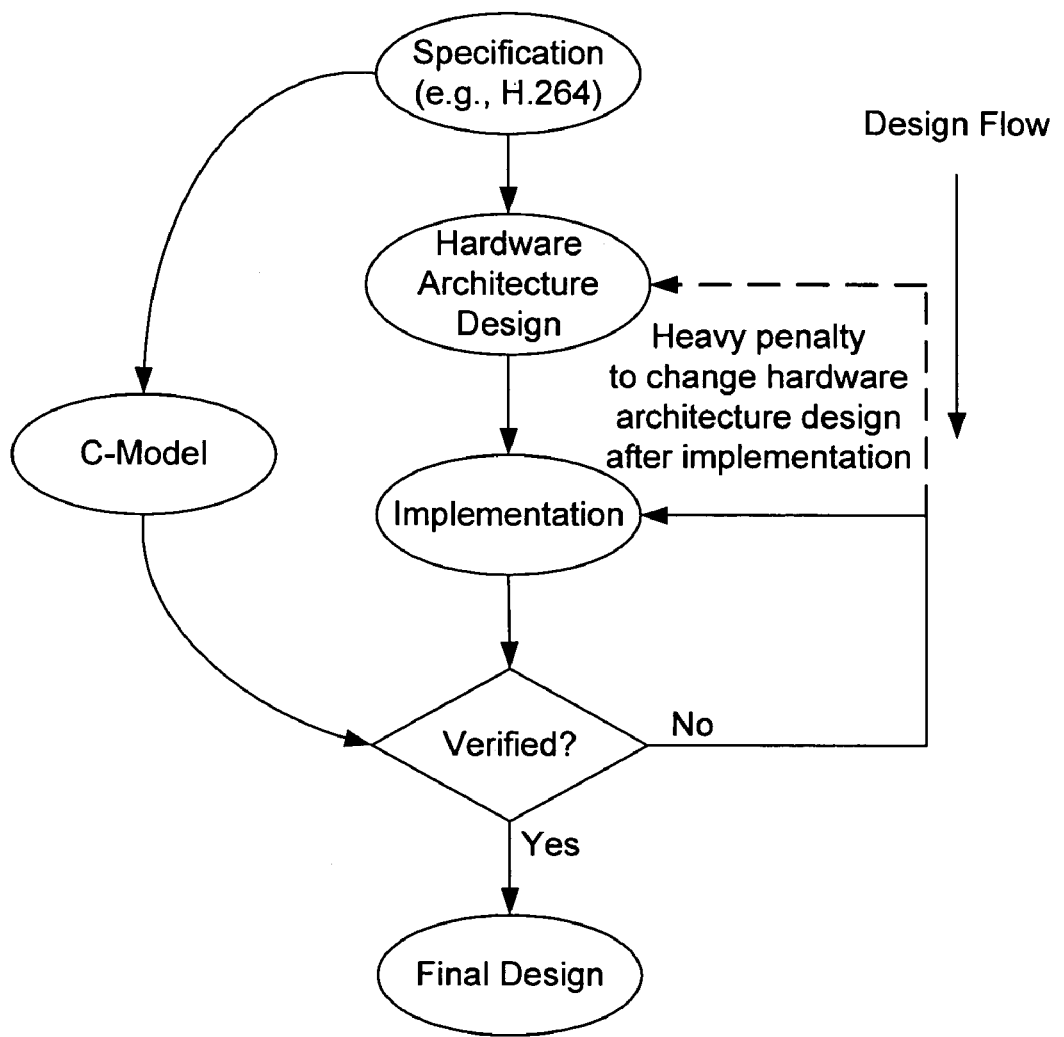
FIG. 1 illustrates the flow of a typical video processing architecture design process.
Figure 2:
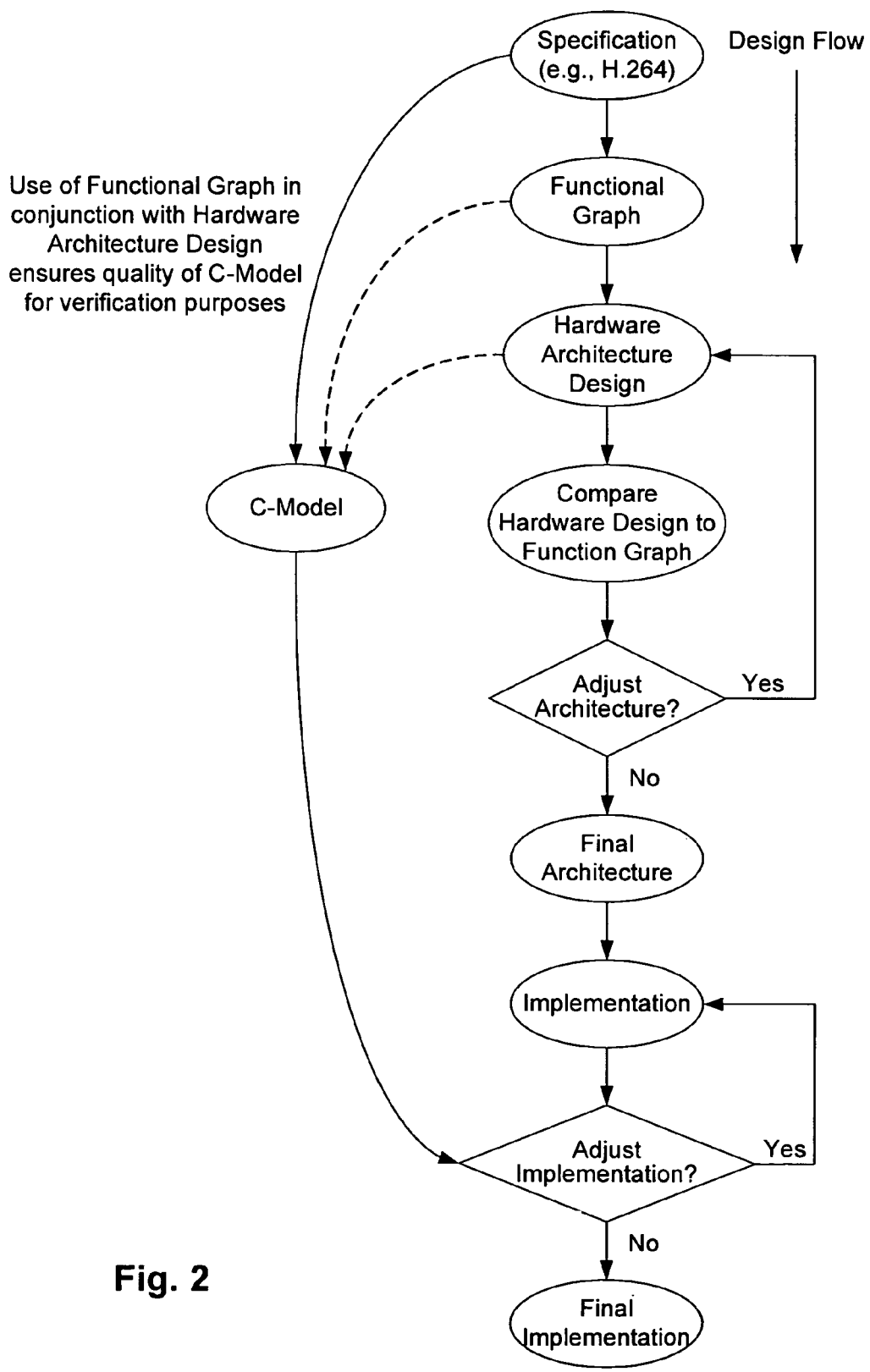
FIG. 2 illustrates the flow of a video processing architecture design process in accordance with one embodiment of the present invention.

FIG. 2 illustrates the flow of a video processing architecture design process in accordance with one embodiment of the present invention. The design process begins with a video design specification or standard. As can be seen, the specification is this example is the AVC standard, although other video processing standards can be used here as well.

A function graph is derived from the specification, and is essentially a tool that bridges the disconnect between the specification and the hardware designer. In particular, a function graph includes five components: an external source/target, functional nodes, data elements, inter-node communication, and control information. Use of a function graph enables a designer to comply with the requirements of the specification early in the hardware architecture design process. The function graph and its five components will be discussed in greater detail with reference to FIGS. 3a, 4, 5a, and 5b.

A hardware architecture design is developed for the particular application at hand, with reference to the function graph. Conventional hardware architecture design techniques can be employed here. Note that reference to the function graph can occur in a number of ways. For example, the designer can reference the function graph manually during the hardware architecture design phase. Alternatively, or in addition to, the function graph can be referenced automatically during a computer implemented hardware architecture design phase.

The video processing architecture design process then proceeds with comparing the proposed hardware architecture design with the functional graph to determine if the design is fully compliant. If not, then the designer is given the opportunity to adjust the architecture as necessary. If the hardware architecture design complies with the functional graph, then a final architecture is provided so that implementation can be carried out.

With the architecture finalized, the implementation phase commences. Any number of conventional or custom RTL implementation techniques can be used here. The resulting implementation is then submitted to a verification process using the C-model as normally performed. However, note that the use of the function graph in conjunction with the hardware architecture design ensures the quality of the C-model for the verification process (as indicated by the dashed lines from the function graph and hardware architecture design to the C-model).

Adjustments can be made to the implementation as necessary, and the verification process repeated for each proposed implementation. Once the implementation is verified against the C-model, a final implementation if provided. This RTL implementation can then be synthesized into a gate-level netlist. The resulting schematic of the gate level netlist can then be used as a guide for the overall block and function placement (floor planning), specific gate placement (pick-n-place), and layout of physical interconnections (routing).

Figure 3A:
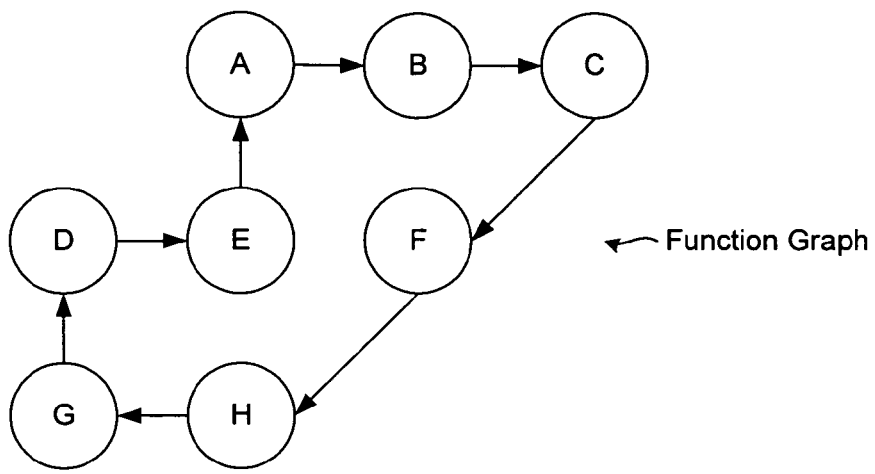
FIG. 3a illustrates an example function graph that can be used in a video processing architecture design process, in accordance with one embodiment of the present invention.
Figure 3B:
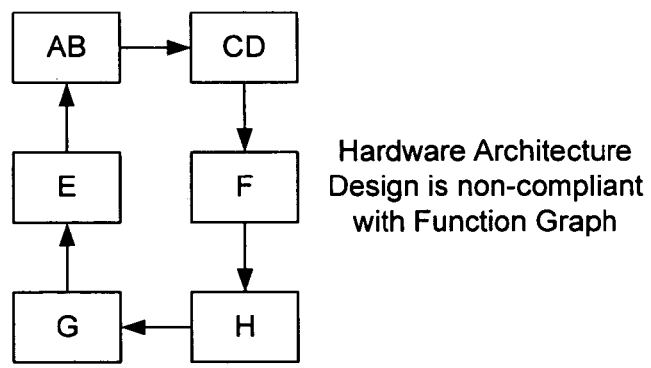
Figure 3C:
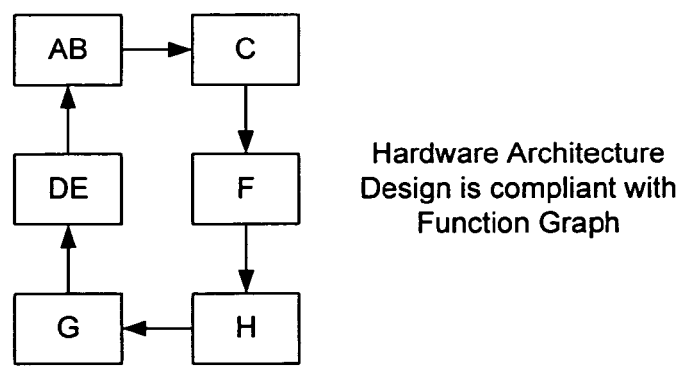

As previously explained, use of the function graph in conjunction with the hardware architecture design facilitates verification of the RTL implementation against the C-model. FIGS. 3a, 3b, and 3c demonstrate the relationship between the function graph and the hardware architecture design.

In more detail, FIG. 3a illustrates an example function graph that can be used in a video processing architecture design process, in accordance with one embodiment of the present invention. As can be seen, the function graph includes a number of functional nodes (A through H) and the interconnections between those nodes. FIG. 3b illustrates an example hardware architecture design that is non-compliant with the function graph of FIG. 3a. For example, the proposed hardware architecture design is missing the interconnection between nodes G and D, as well as the interconnection between nodes D and E. These non-compliant aspects of the design can be identified, for example, visually (by comparing the function graph to the design), or electronically (using gate level logic representations of the compared components).

Without this comparison of the hardware architecture design to the function graph, the design would be presented for RTL implementation, and would fail verification because the missing interconnections. Thus, a design system configured in accordance with an embodiment of the present invention would allow the designer to adjust the hardware architecture design. An example adjusted hardware architecture design is shown in FIG. 3c, which illustrates a hardware architecture design that is compliant with the function graph of FIG. 3a. Note that functions can be grouped (e.g., function A is grouped with function B in FIG. 3a), so long as the necessary interconnections are provided. Function graphs will now be discussed in more detail with reference to FIG. 4.

Functional Graph

Figure 4:
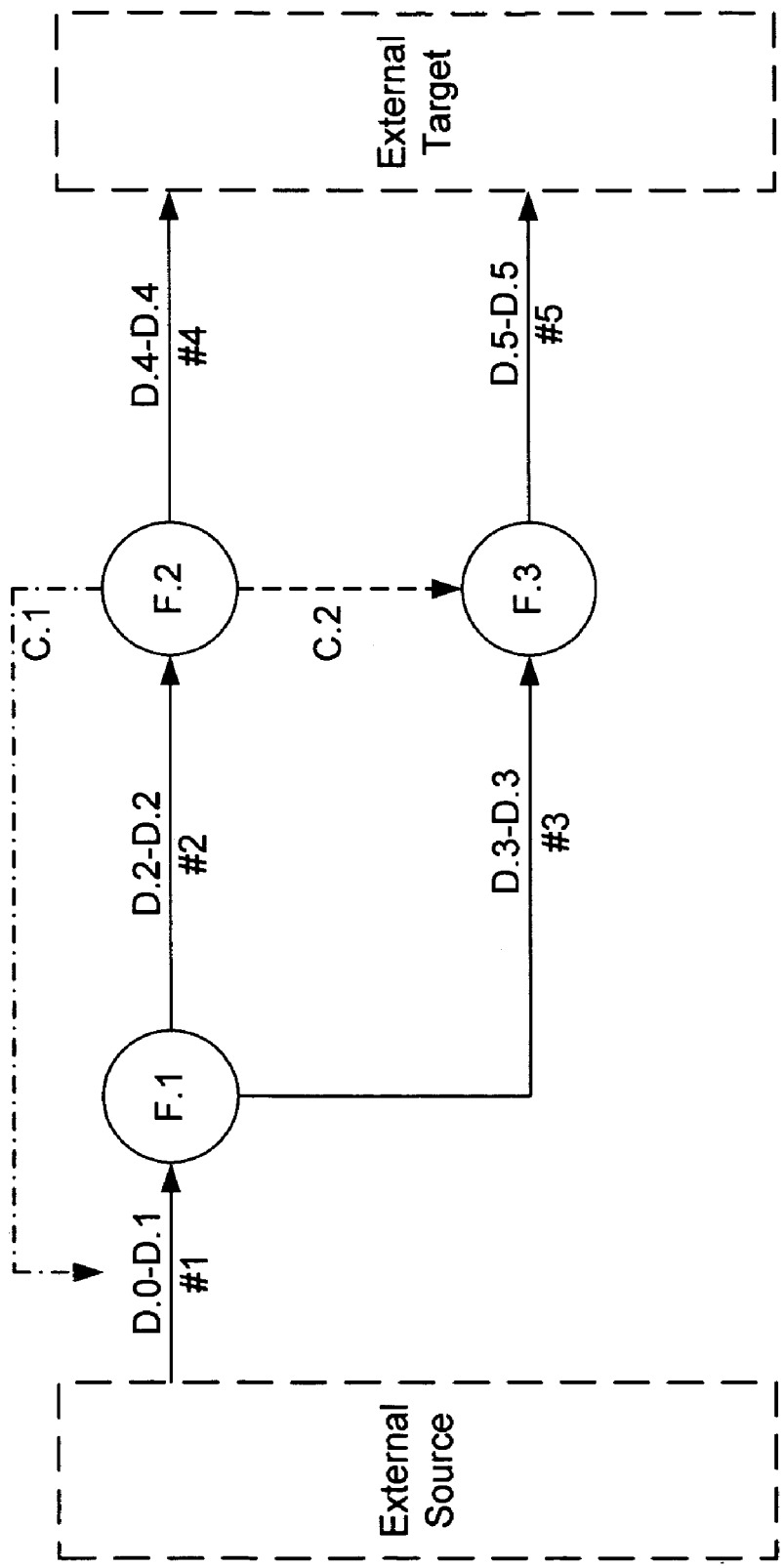
FIG. 4 illustrates a function graph configured in accordance with one embodiment of the present invention.

FIG. 4 is an example of a functional graph in accordance with an embodiment of the present invention. A function graph is a way to describe how a meaningful scenario is fulfilled, which in this example is a video processing system, and in particular, a video coder/decoder (CODEC). The function graph contains five important concepts: an external source and external target, functional nodes, data elements, inter-node communication, and control information.

The external source provides input to the CODEC, while the external target provide receives output from the CODEC. Each can be, for example, some type of external storage that is not necessary to be defined in the CODEC.

Functional nodes are represented by the cycles in the graph (e.g., F.1, F.2, F.3), with each node performing a specific data processing function. Any number of known or otherwise necessary video processing routines or functionality can be represented with functional nodes. Example functions include front-end blocks such as motion related functions (e.g., vector search functions, vector-based prediction functions, pre-coding decision functions, macro-block level de-interlace functions, and filter functions), and compression-loop blocks such as compression functions (e.g., universal variable length decoder/encoder for video stream element functions, CABAC encoder and decoder functions, reconstruction functions including de-quantization, IDCT, and de-compensation, and transform loop functions including de/compensation, I/DCT, de/quantization and post-quantization processing) and control functions (e.g., pre-decode slice function, pre-decode macro-block function, sequence control, pre-encode macro-block function, macro-block encoding control function, and post-coding decision function). Each functional node has at least one data input/output, and also receives and/or provides control information.

A data element is content over the black arrows (e.g., D.0, D.1, D.2, D.3, D.4, D.5), and indicates a certain type of data that can be an input or output of a functional node. In general, data elements consume the largest portion of the bandwidth on the major buses. All types of data structures can be processed and transferred. Data elements travel, for example, between external RAM and front-end processing blocks, between external RAM and compression-loop blocks, from/to an internal cache, and/or through a processor data bus.

Inter-node-communication is depicted using arrows (e.g., #1, #2, #3, #4, #5), like a virtual data pipe, always from one functional node to another to pass the data elements. Inter-node-communication could be a cache, a buffer, a bus, or just a set of internal wires. Note that if a cache/buffer is involved, the data elements on 2 ends may be different, depending on the particular CODEC architecture specification from which the function graph is derived. Inter-node-communication can be, for example, between an external source and a motion engine, between an external source and other front-end processing blocks, between front-end processing blocks, between front-end compression loops, between compression-loop blocks, and between a compression-loop and an external source.

Control information is also depicted using arrows (C.1, C.2), and is provided by a functional node and passed to control another node or a data pipe (inter-node-communication). A dashed arrow (e.g., C.2) indicates macro-block level control, while the dashed-dotted (e.g., C.1) arrow indicates picture/slice level control, which occurs relatively less frequently. Note that other shared information not designated as control information could be treated as global variables in a control processor. Example control information includes macro-block control information (e.g., motion related control and compression loop control) and upper level control information (e.g., sequence preparation and picture processing information).

A number of example functional nodes, data elements, inter-node-communications, and control information are described in the previously incorporated U.S. Provisional Application No. 60/635,114, as well as a number of example functional graphs. Note, however, that the specific functional nodes, data elements, inter-node-communications, control information, and functional sub-graphs employed will depend factors such as the underlying video processing specification and the performance requirements of the targeted application. The present invention is not intended to be limited to any one such set of circumstances, but can readily be applied to any video processing design project.

Variations will be apparent in light of this disclosure. For instance, note that a functional node may combine two different processes, such as a function module that performs both CABAC coding and decoding. Also, an overall function graph can be made from a number of function sub-graphs. The degree of modularity can be varied to suit the designer's preferences. Generally stated, the greater the degree of modularity in functional nodes and graphs, the easier to compartmentalize functional concepts required by the specification.

Design System

Figure 5A:
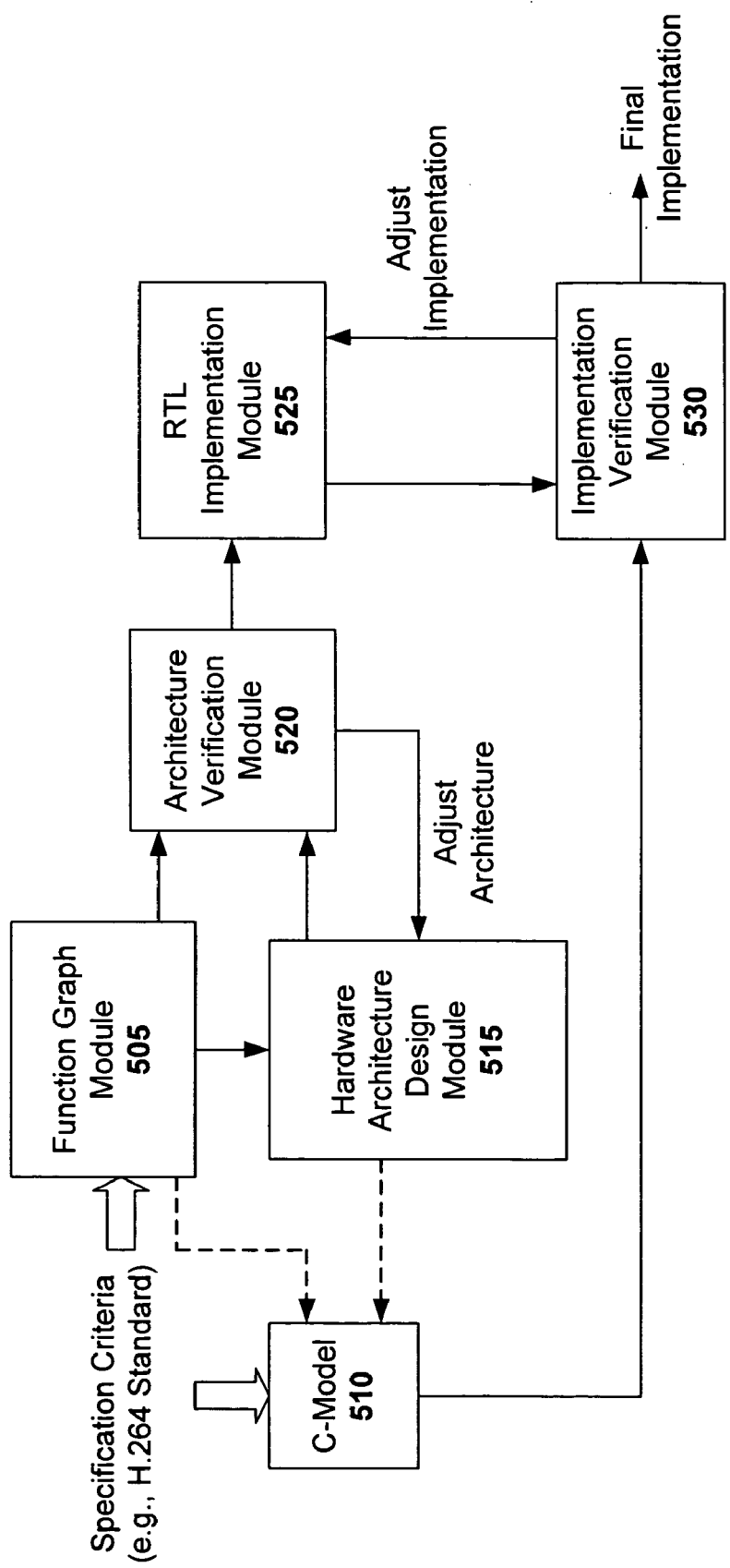
FIG. 5a is a block diagram of a system for carrying out a video processing architecture design process in accordance with one embodiment of the present invention.

FIG. 5a is a block diagram of a system for carrying out a video processing architecture design process in accordance with one embodiment of the present invention. This particular example design system includes a function graph module 505, a C-model 510, a hardware architecture design module 515, an architecture verification module 520, an RTL implementation module 525, and an implementation verification module 530. User input and interaction with the system is provided as needed, as will be apparent in light of this disclosure. A final implementation is provided that can then be synthesized into a gate-level netlist.

Other components and features not shown may also be included in the system, such as graphical user interfaces that facilitate user interaction with the various components of the system, and back-end processing tools (e.g., floor planning, pick-n-place, and routing tools).

As previously discussed, the design process begins with a video design specification or standard, which in this case is the AVC standard, although other video processing standards can be used here as well. The function graph module 505 is configured to generate function graphs that are derived from or otherwise based in the specification. The resulting function graphs describe a set external source/targets, functional nodes, data elements, inter-node communication, and control information that graphically represent the specification criteria.

The function graph module 505 can be implemented, for example, as a graphical drawing package that allows the designer to create and modify function graphs that can be printed or otherwise viewed for the purpose of carrying out a manual verification process. Alternatively, the function graph module 505 can be implemented with custom built logic and/or software, where each of the function graph components are represented by a routine (e.g., functional nodes), data structures or variables (e.g., data elements), logic (e.g., inter-node communication and control information), or other mathematical models. The function graph module 505 is discussed in greater detail with reference to FIG. 5b.

The C-model 510 can be implemented with conventional technology, and is derived from the specification as normally done. However, and as previously explained, use of the functional graph in conjunction with the hardware architecture design phase ensures the quality of the C-model 510 for verification purposes (as indicated by the dashed lines from the function graph module 505 and the hardware architecture design module 515 to the C-model 510).

The hardware architecture design module 515 can be implemented with conventional technology, and is configured to develop a hardware architecture design for the particular application at hand, with reference to the function graph(s) provided by module 505. Recall that reference to a function graph can occur in a number of ways. For example, the designer can reference the function graph manually during the hardware architecture design phase, where printed or on-screen versions of the relevant function graphs are available for review by the designer. Components of the proposed hardware architecture design can therefore be visually compared to the function graphs for compliance.

Alternatively, or in addition to, the function graph can be referenced automatically during a computer implemented hardware architecture design phase. In one such embodiment, the components of the function graph (external source/targets, functional nodes, data elements, inter-node communication, and control information) are represented in programmable logic and/or software that is integrated or otherwise interfaced with a conventional hardware architecture design tool. Here, components of the proposed hardware architecture design are logically and/or mathematically compared to the function graphs for compliance.

In any such manual or automatic cases, as design choices are made, the function graph can be consulted and compared with the proposed design for verification purposes. Such crosschecking during the hardware architecture design facilitates a final implementation that is compliant with all specification criteria. In the embodiment shown, the crosschecking is carried out by the architecture verification module 520. For manual verification, the architecture verification module 520 can be configured with a split screen monitor that allows the designer to view both the proposed hardware architecture design and the function graph. Segmented viewing can be used for larger designs, is so desired.

For automatic verification, the architecture verification module 520 can be configured with a number of logical cross-checking routines. In one particular comparison scenario, each component of the function graph is grouped and tallied. For instance, the function graph example shown in FIG. 4 has two external source/targets (e.g., RAMs), three functional nodes (F.1, F.2, and F.3), five data elements (e.g., D.0, D.1, D.2, D.3, D.4, D.5), five inter-node communications (#1, #2, #3, #4, #5), and two control information (C.1, C.2). Thus, a total of seventeen components. The proposed hardware architecture design should have a total of seventeen such components as well, which can be confirmed by correlating the number various design components used by the hardware architecture design module 515 to the number of corresponding components used by the function graph module 505. For a more detailed verification, the logical representations of the design components used by the hardware architecture design module 515 can be correlated and compared to the logical representations of the components used by the function graph module 505. This detailed component-level comparison can be performed in addition to the general component tally-based comparison, or in lieu of the tally-based comparison. Numerous conventional modeling and comparison techniques can be employed here, and the present invention is not intended to be limited to any one such embodiment.

Regardless of how the comparison is performed, if the design is not fully compliant, then the designer is given the opportunity to adjust the architecture as necessary. If the hardware architecture design complies with the functional graph, then a final architecture is provided so that RTL implementation can be carried out by the RTL implementation module 525, which can be implemented with conventional RTL implementation techniques. The implementation verification module 530 can also be implemented with conventional technology, and is configured to verify the proposed RTL implementation against the C-model 510. The designer is given opportunity to adjust the implementation as necessary, until a final implementation is achieved that can be provided to front-end processing tools. The verified implementation can then be realized in semi-conductor material (e.g., silicon).

Figure 5B:
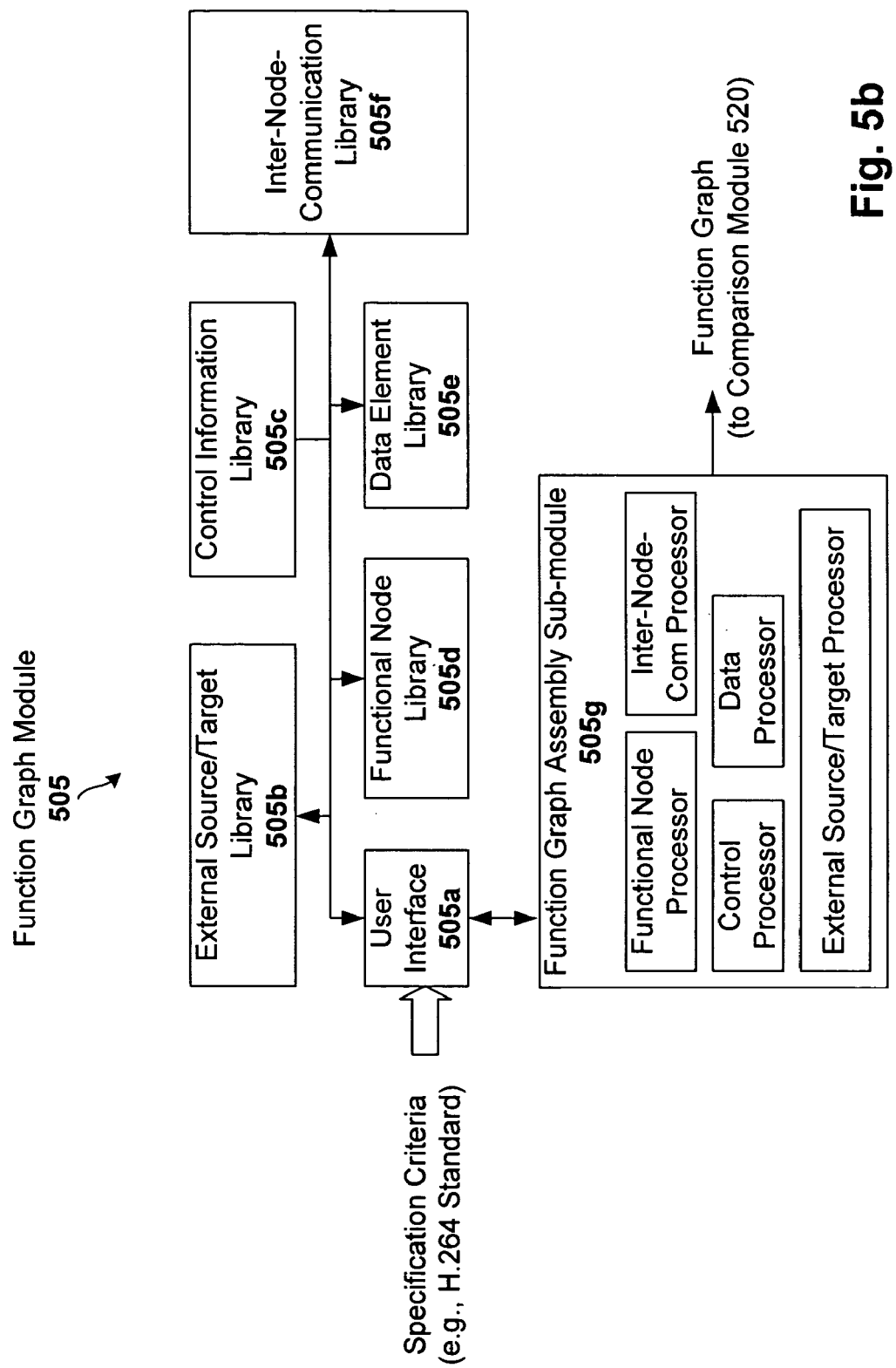
FIG. 5b is a block diagram of the function graph module in the system of FIG. 5a, configured in accordance with one embodiment of the present invention.

FIG. 5*b* is a block diagram of a function graph module 505, configured in accordance with one embodiment of the present invention. In this particular embodiment, the function graph module 505 includes a user interface 505, an external source/target library 505*b*, a control information library 505*c*, a functional node library 505*d*, a data element library 505*e*, an inter-node-communication library 505*f*, and a function graph assembly sub-module 505*g*.

The user interface 505*a* can be implemented as a graphical user interface, and enables the user to interact with the module 505. Specification criteria is input via the user interface 505*a*, and can be stored in a RAM or other memory available to the module, if so desired. As previously explained, a function graph includes five components is derived from the specification criteria. The user interface 505*a* allows the user to build each of the external sources/targets, functional nodes, data elements, inter-node communication, and control information components reflected in the specification criteria, and to send each of the components to their respective electronic libraries over the bus interconnecting the libraries and the user interface 505*a*. Thus, all possible variations of the function graphs embraced by the specification criteria are represented in the libraries.

Example external sources/targets in the external source/target library 505*b* include various external RAMs and other data and control sources that provide information to the CODEC being modeled. Example control information stored in the control information library 505*c* includes macro-block control information (e.g., motion related control and compression loop control) and upper level control information (e.g., sequence preparation and picture processing information). Note that macro-block level control can be distinguished from the less frequent picture/slice level control within the library 505*c*. The library 505*c* may also include other shared information not designated as macro-block level control or picture/slice level control information, but that could be treated as global variables in the control processor of the function graph assembly module 505*g*.

Example functional nodes stored in the functional node library 505*d* include front-end blocks such as motion related functions (e.g., vector search functions, vector-based prediction functions, pre-coding decision functions, macro-block level de-interlace functions, and filter functions), and compression-loop blocks such as compression functions (e.g., universal variable length decoder/encoder for video stream element functions, CABAC encoder and decoder functions, reconstruction functions including de-quantization, IDCT, and de-compensation, and transform loop functions including de/compensation, I/DCT, de/quantization and post-quantization processing) and control functions (e.g., pre-decode slice function, pre-decode macro-block function, sequence control, pre-encode macro-block function, macro-block encoding control function, and post-coding decision function). Each functional node has at least one data input/output, and also receives and/or provides control information.

Data elements stored in the data element library 505*e* include all types of data structures that can be processed and transferred. Example inter-node-communication stored in the inter-node-communication library 505*f* includes inter-node-communication between an external source and a motion engine, between an external source and other front-end processing blocks, between front-end processing blocks, between front-end compression loops, between compression-loop blocks, and between a compression-loop and an external source. Note that the electronic library can designate each of the communications with a unique ID, and specify the data producer (e.g., functional node or external source), the data consumer (e.g., functional node), and the in/out data elements associated with each data pipe. Further note that the in/out data elements for a particular inter-node-communication need not be the same.

In one particular embodiment, the inter-node-communication is for transferring data elements only (e.g., assisted by a semaphore mechanism in hardware), and not for transferring control information. In such an embodiment, control information is generally connected to processor or internal controllers through control busses, which are usually not necessary to be controlled by other special mechanisms, such as a logical semaphore mechanism.

A number of example functional nodes, data elements, inter-node-communications, and control information that can be stored in the corresponding libraries are described in the previously incorporated U.S. Provisional Application No. 60/635,114, as well as a number of example functional graphs that can be created from those libraries.

The function graph assembly module 505*g* is configured to build the function graph based on user input from the user interface 505*a*, and includes a functional node processor, an inter-node-communication processor, a control processor, a data processor, and an external source/target processor. Each of these dedicated processors operates in conjunction with the other processors to assemble the selected components of the function graph, which is then output of the function graph module 505 for subsequent use by the comparison module 520.

Note that although individual components are shown here for the purpose of illustration, other embodiments may have one or more of the components integrated with other components included in the system. For instance, the processors of the function graph assembly module can each be implemented as a set of instructions executing on a digital signal processor (DSP) or other suitable processing environment (e.g., FPGA or ASIC). Likewise, the electronic libraries can be integrated into one large library that is indexed according to component type, wherein each component sub-section of the overall library is sub-indexed as necessary to distinguish each entry for selection purposes during the function graph building process.

Also, note that the function graph module 505 can also be implemented, for example, with an off-the-shelf drawing package that allows a user to create printed or otherwise viewable function graphs configured in accordance with an embodiment of the present invention, that can be used by a designer to then create and verify a particular hardware architecture design.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for designing video processing architecture in accordance with a video processing a particular specification, comprising:
   generating a function graph that graphically represents criteria of the specification, the function graph having input from an external source and providing output to an external target, and including a plurality of functional nodes each for performing a specific data processing function, one or more data elements input to and/or output from a functional node, inter-node communication between the functional nodes, and control information provided by a functional node to control another functional node or inter-node-communication;
   generating a hardware architecture design for a video processing application;
   comparing the hardware architecture design to the function graph to determine if the design complies with the function graph; and
   in response to determining the hardware architecture design complies with the functional graph, providing a final architecture for register transfer level (RTL) implementation.

2. The method of claim 1 further comprising:
   in response to determining the hardware architecture design does not comply with the functional graph, allowing adjustment to the hardware architecture design as necessary.

3. The method of claim 1 wherein the specification is the H.264 specification.

4. The method of claim 1 wherein generating a function graph that graphically represents criteria of the specification includes accessing one or more electronic libraries that store external sources/targets, functional nodes, data elements, inter-node communication, and control information components reflected in the specification.

5. The method of claim 1 wherein comparing the hardware architecture design to the function graph is carried out using electronic logical comparisons between one or more components of the function graph and a corresponding one or more components of the hardware architecture design.

6. The method of claim 1 further comprising:
   performing RTL implementation of the final architecture.

7. The method of claim 6 further comprising:
   comparing the RTL implementation to a C-model derived from the specification to determine if the RTL implementation complies with the C-model.

8. The method of claim 7 further comprising:
   in response to determining the RTL implementation complies with the C-model, providing a final RTL implementation that can be synthesized into a gate-level netlist.

9. The method of claim 7 further comprising:
   in response to determining the RTL implementation does not comply with the C-model, allowing adjustment to the RTL implementation as necessary.

10. A method for designing video processing architecture in accordance with a video processing a particular specification, comprising:
    generating a function graph that graphically represents criteria of the specification, the function graph having input from an external source and providing output to an external target, and including a plurality of functional nodes each for performing a specific data processing function, one or more data elements input to and/or output from a functional node, inter-node communication between the functional nodes, and control information provided by a functional node to control another functional node or inter-node-communication;
    generating a hardware architecture design for a video processing application;
    comparing the hardware architecture design to the function graph to determine if the design complies with the function graph;
    in response to determining the hardware architecture design complies with the functional graph, providing a final architecture;
    in response to determining the hardware architecture design does not comply with the functional graph, allowing adjustment to the hardware architecture design as necessary;
    performing register transfer level (RTL) implementation of the final architecture; and
    comparing the RTL implementation to a C-model derived from the specification to determine if the RTL implementation complies with the C-model; and
    in response to determining the RTL implementation does not comply with the C-model, allowing adjustment to the RTL implementation as necessary.

11. The method of claim 10 further comprising:
    in response to determining the RTL implementation complies with the C-model, providing a final RTL implementation that can be synthesized into a gate-level netlist.

12. A system for designing video processing architecture in accordance with a video processing a particular specification, comprising:
    a function graph module for generating a function graph that graphically represents criteria of the specification, the function graph having input from an external source and providing output to an external target, and including a plurality of functional nodes each for performing a specific data processing function, one or more data elements input to and/or output from a functional node, inter-node communication between the functional nodes, and control information provided by a functional node to control another functional node or inter-node-communication;
    a hardware architecture design module for generating a hardware architecture design for a video processing application; and
    an architecture verification module for comparing the hardware architecture design to the function graph to determine if the design complies with the function graph, and if so, for providing a final architecture for register transfer level (RTL) implementation.

13. The system of claim 12 wherein in response to determining the hardware architecture design does not comply with the functional graph, the architecture verification module is further configured to allow adjustment to the hardware architecture design as necessary.

14. The system of claim 12 wherein the specification is the H.264 specification.

15. The system of claim 12 further wherein the function graph module is further configured to access one or more electronic libraries that store external sources/targets, functional nodes, data elements, inter-node communication, and control information components reflected in the specification.

16. The system of claim 12 wherein the architecture verification module is further configured to carryout electronic logical comparisons between one or more components of the function graph and a corresponding one or more components of the hardware architecture design.

17. The system of claim 12 further comprising:
an RTL implementation module for performing RTL implementation of the final architecture.

18. The system of claim 17 further comprising:
an implementation verification module for comparing the RTL implementation to a C-model derived from the specification to determine if the RTL implementation complies with the C-model.

19. The system of claim 17 wherein in response to determining the RTL implementation complies with the C-model, the implementation verification module is further configured to provide a final RTL implementation that can be synthesized into a gate-level netlist.

20. The system of claim 17 wherein in response to determining the RTL implementation does not comply with the C-model, the implementation verification module is further configured to allow adjustment to the RTL implementation as necessary.

* * * * *